(12) United States Patent
Kwon et al.

(10) Patent No.: US 7,737,539 B2
(45) Date of Patent: Jun. 15, 2010

(54) INTEGRATED CIRCUIT PACKAGE SYSTEM INCLUDING HONEYCOMB MOLDING

(75) Inventors: Hyeog Chan Kwon, Seoul (KR); Hyun Joung Kim, Namyangju (KR); Jae Chang Kim, Changwon (KR); Taeg Ki Lim, Cheongju-si (KR); Jong Wook Ju, Ichon-si (KR)

(73) Assignee: STATS Chippac Ltd., Singapore (SG)

( * ) Notice: Subject to any disclaimer, the term of this patent is extended or adjusted under 35 U.S.C. 154(b) by 0 days.

(21) Appl. No.: 11/306,854

(22) Filed: Jan. 12, 2006

(65) Prior Publication Data

US 2007/0158806 A1      Jul. 12, 2007

(51) Int. Cl.
   *H01L 23/02* (2006.01)
(52) U.S. Cl. .............. 257/686; 257/E23.085; 257/E25.023; 438/109
(58) Field of Classification Search ........ 257/685, 257/686; 438/109
   See application file for complete search history.

(56) References Cited

U.S. PATENT DOCUMENTS

| | | | |
|---|---|---|---|
| 5,608,265 A * | 3/1997 | Kitano et al. ............... 257/738 |
| 6,180,881 B1 * | 1/2001 | Isaak ............................. 174/524 |
| 6,455,928 B2 | 9/2002 | Corisis et al. ................ 257/686 |
| 6,469,374 B1 | 10/2002 | Imoto ........................... 257/686 |
| 6,522,022 B2 | 2/2003 | Murayama .................... 257/786 |
| 6,611,012 B2 | 8/2003 | Miyamoto et al. ........... 257/286 |
| 6,700,783 B1 | 3/2004 | Liu et al. ...................... 361/704 |
| 6,740,964 B2 | 5/2004 | Sasaki .......................... 257/687 |
| 6,770,980 B2 | 8/2004 | Shibata ......................... 257/777 |
| 6,781,241 B2 | 8/2004 | Nishimura et al. ........... 257/777 |
| 6,847,109 B2 * | 1/2005 | Shim ............................ 257/697 |
| 6,936,922 B1 | 8/2005 | Park et al. .................... 257/737 |
| 2002/0066952 A1 * | 6/2002 | Taniguchi et al. ........... 257/698 |
| 2003/0006494 A1 | 1/2003 | Lee et al. ...................... 257/686 |
| 2004/0262732 A1 * | 12/2004 | Noma et al. ................. 257/685 |
| 2005/0263869 A1 * | 12/2005 | Tanaka et al. ................ 257/686 |

\* cited by examiner

*Primary Examiner*—Sue A Purvis
*Assistant Examiner*—Krista Soderholm
(74) *Attorney, Agent, or Firm*—Mikio Ishimaru (57) ABSTRACT

An integrated circuit package system including a substrate with a top surface and a bottom surface. Configuring the top surface to include electrical contacts formed between a perimeter of the substrate and a semiconductor die. Aligning over the top surface of the substrate a mold plate with a honeycomb meshwork of posts or a stepped honeycomb meshwork of posts and depositing a material to prevent warpage of the substrate between the top surface of the substrate and the mold plate. Removing the mold plate to reveal discrete hollow conduits formed within the material that align with the electrical contacts.

19 Claims, 8 Drawing Sheets

INTEGRATED CIRCUIT PACKAGE SYSTEM INCLUDING HONEYCOMB MOLDING

TECHNICAL FIELD

The present invention relates generally to an integrated circuit system, and more particularly to an integrated circuit package system including honeycomb molding.

BACKGROUND ART

The use of wafers is a cost-effective way to concurrently fabricate many semiconductor chips. Each semiconductor chip may contain several million active and passive devices that make up the Integrated Circuit (IC) systems that are so prevalent in our world. The most familiar applications of IC systems are found in cellphones, camcorders, portable music players, televisions, and computers.

Once all the chips are fabricated and tested at the wafer level, the chips are separated from the wafer and assembled into final integrated circuit package systems. The assembly and package process takes Known Good Die (KGD), places them in a package, and interconnects the device bonding pads to the package leads. As customer demand improves chip performance, new requirements are placed on integrated circuit package. To meet this demand, the semiconductor industry had begun stacking individual chips and even packages one over the other in an effort to decrease size while increasing computing power.

While these stacked die packages have increased functional integration in ultra thin profiles, the lack of known good sub-assemblies in these stacked die packages necessitates the pre-testing of packaged three-dimensional configurations. As a result, stacking pre-tested packages together in a single configuration is emerging as an option. For example, these options include package-on-package (PoP) three-dimensional technology and package-in-package (PiP) three-dimensional technology. PoP is a three-dimensional package structure in which fully tested packages, such as, single die Fine Ball Grid Array (FBGA) or stacked die FBGA are stacked one on top of another single die or stacked die FBGA. PiP technology employs stacking a tested internal stacking module on top of a base assembly package to form a single chip scale package.

PoP and PiP three-dimensional technology is becoming popular due to their KGD aspect. However, one of the major disadvantages of this technology is that for the bottom package, only the area directly around the dies are molded, leaving the outer perimeter regions of the substrate exposed. These exposed outer perimeter substrate regions, which contain electrical connection sites and no molding compound, are subject to severe warpage after ball mount and reflow. The warpage of the bottom substrate arises due to the differences in thermal expansion between the semiconductor chip, the substrate, the solder balls and the molding compound. Most notably, after deposition of the molding compound, the over-contraction of the molding compound during cooling causes the substrate to warp.

Substrate warpage becomes an issue in stacked package design because of failed interconnects between a top and bottom package. Since substrate warpage causes the solder balls to be located out of plane, they make a poor electrical connection or fail to make an electrical connection at all with the target substrate. Such inconsistencies in stacked package configurations cause unacceptable package yields and unacceptable device failures upon integration into consumer products. Needless to say, such inconsistencies can also increase production costs.

Attempts have been made to combat the warpage of substrates. For instance, reinforcement layers have been affixed to the surfaces of substrates to provide structural support. Unfortunately, such measures require extra processing steps, which can increase the cost of production.

Other attempts to combat substrate warpage have incorporated a flexible adhesive agent between adjacent substrates or packages. Unfortunately the adhesive agents add bulk to the overall chip design, and consequently, are contrary to the goals of semiconductor manufacturing of reducing package dimensions.

Finally, additional attempts at controlling substrate warpage include depositing an encapsulation layer and then lasing through the encapsulation layer to uncover the electrical circuitry. Regrettably such attempts contend with damage caused by the laser and also require additional manufacturing steps, which increase the cost of production.

Thus, a need still remains for stacked package configurations that exhibit solid and consistent electrical connections between adjacent packages. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including a substrate with a top surface and a bottom surface. Configuring the top surface to include electrical contacts formed between a perimeter of the substrate and a semiconductor die. Aligning over the top surface of the substrate a mold plate with a honeycomb meshwork of posts or a stepped honeycomb meshwork of posts and depositing a material to prevent warpage of the substrate between the top surface of the substrate and the mold plate. Removing the mold plate to reveal discrete hollow conduits formed within the material that align with the electrical contacts.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

As mentioned above, device or package failure due to failed interconnections between adjacent substrates can reduce product yield and increase production costs. The present invention addresses this problem by providing a package system that prevents substrate warpage, and correspondingly, enhances the reliability of interconnections between adjacent substrates.

Figure 1:
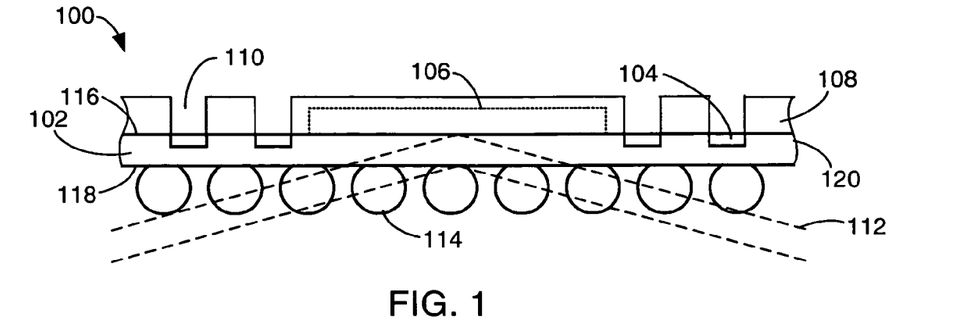
FIG. 1 is a section view of an integrated circuit package system after reflow in accordance with an embodiment of the present invention.

Referring now to FIG. 1, therein is shown a section view of an integrated circuit package system 100 after reflow in accordance with an embodiment of the present invention. FIG. 1 depicts the integrated circuit package system 100, such as a bottom package, including a substrate 102, electrical contacts 104, a semiconductor die 106, a material 108, discrete hollow conduits 110, such as, first discrete hollow conduits, or second discrete hollow conduits, dotted lines 112, external electrical connections 114, a top surface 116, a bottom surface 118, and a perimeter 120. The substrate 102 includes the electrical contacts 104. The material 108, formed over the substrate 102 and the semiconductor die 106, includes the discrete hollow conduits 110 formed over the electrical contacts 104. Most notably, FIG. 1 illustrates that the substrate 102 experiences little deflection from its original horizontal plane. The substrate 102 remains rigidly fixed within plane because of the structural support offered by the material 108.

The dotted lines 112 are representative of the characteristic downward warpage incurred by prior art bottom packages. Prior art packages may also deflect upwards, as well as, in more than one direction. The warpage of prior art methods causes a deflection of the external electrical connections 114 out of the original horizontal plane of the substrate 102. Such deflections of the external electrical connections 114 affects their attachment to objects, such as, for example, a printed circuit board. The deflection of the external electrical connections 114 can cause failed or weakened interconnects, which will diminish product yield.

Referring now to FIGS. 2 through 5, therein are shown different mold systems for forming the discrete hollow conduits 110, of FIG. 1, within the material layer 108, of FIG. 1.

Figure 2:
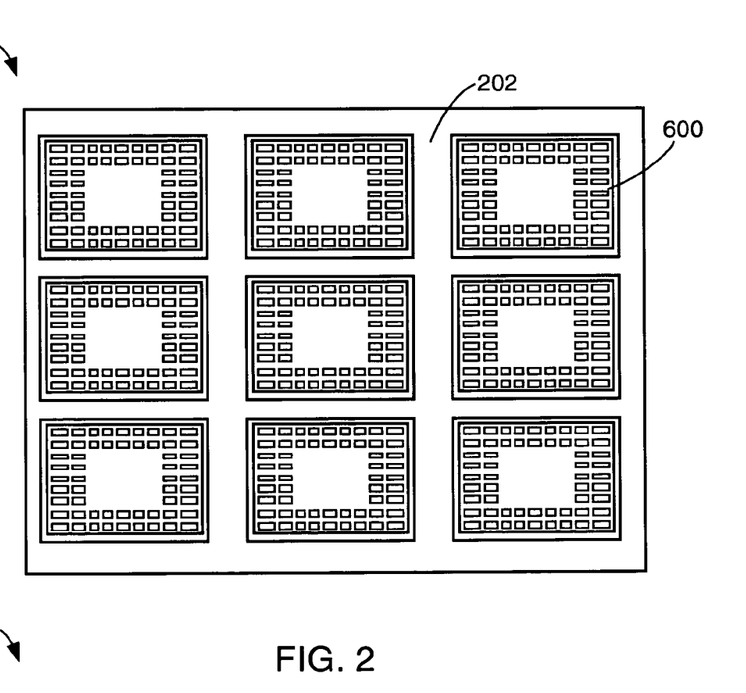
FIG. 2 is a plan view of a top center gate mold system in accordance with an embodiment of the present invention.
Figure 3:
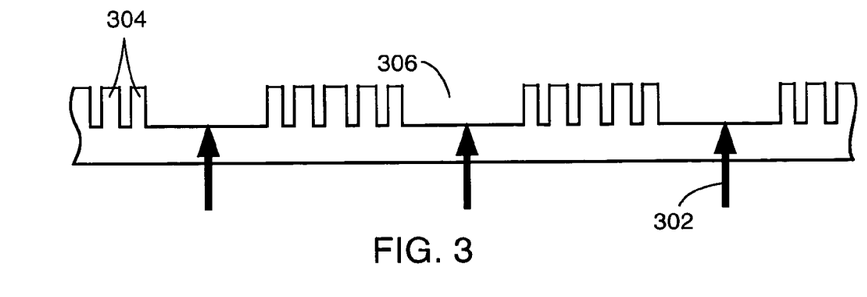
FIG. 3 is a section view of a mold plate, such as a top center gate mold plate design, in accordance with an embodiment of the present invention.

FIGS. 2 and 3, show a plan view of a top center gate mold system 200 and a section view of a mold plate 300, such as, a middle mold plate design, a first mold plate, or a second mold plate, in accordance with an embodiment of the present invention. The mold plate 300, of FIGS. 3 and 5, forms the discrete hollow conduits 110, of FIG. 1. As an exemplary illustration, the top center gate mold system 200, of FIG. 2, depicts a 3×3 array of an integrated circuit package system 600, of FIG. 6. Between each of the integrated circuit package systems 600 are channels 202 that allow for distribution of the material 108, of FIG. 1. After the integrated circuit package systems 600 are aligned to permit formation of the channels 202, the mold plate 300 is placed over the top center gate mold system 200.

Middle mold plate design arrows 302, of FIG. 3, depict gates of entry for the material 108. The material 108 flows around a honeycomb meshwork of posts 304 and fills semiconductor die mold regions 306, as well as, the areas between the honeycomb meshwork of posts 304. After a sufficient amount of time has elapsed, the gate mold 300 is removed, and left in its place is a support layer, comprised by the material 108, with the discrete hollow conduits 110 formed within. Although FIGS. 2 and 3 depict a 3×3 array, it is to be understood that any array suitable for manufacturing may be employed.

Figure 4:
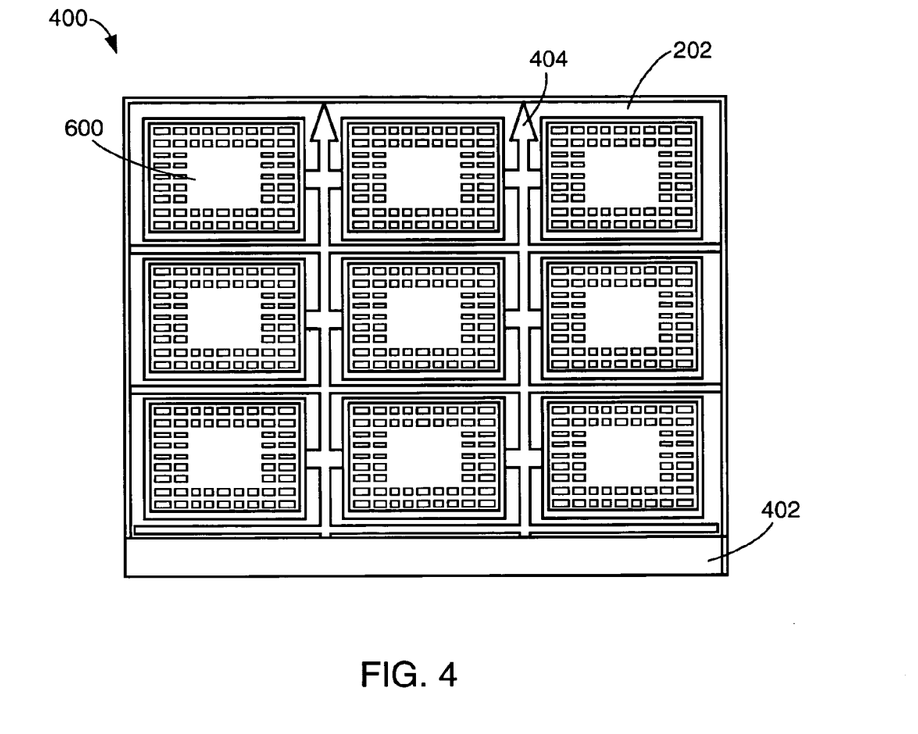
FIG. 4 is a plan view of a conventional mold system in accordance with an embodiment of the present invention.
Figure 5:
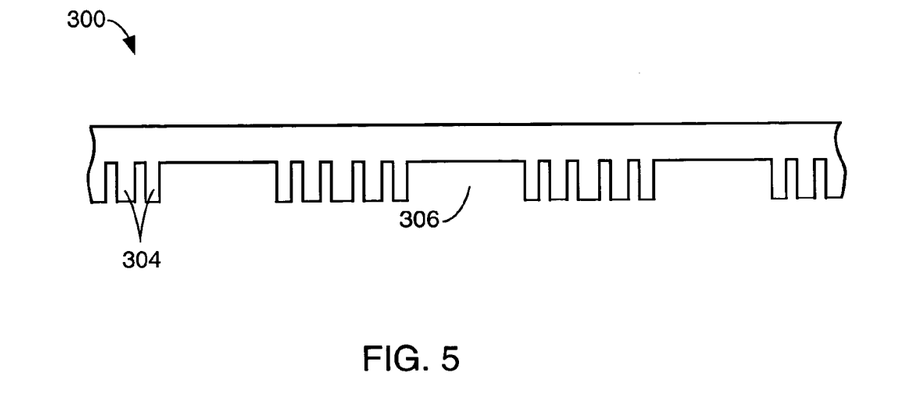
FIG. 5 is a section view of a mold plate, such as a top chaser mold plate, in accordance with an embodiment of the present invention.

FIGS. 4 and 5, show a plan view of a conventional mold system 400 and a section view of a mold plate 300, such as, a top chaser mold plate, the first mold plate, or the second mold plate, in accordance with another embodiment of the present invention. FIGS. 4 and 5 depict similar configurations as to FIGS. 2 and 3, therefore, only the differences between the figures will be described, to avoid redundancy.

During manufacturing, the conventional mold system 400 employs the top chaser mold plate placed over the conventional mold system 400. Just as with the top center gate mold system 200, of FIG. 2, the conventional mold system 400 also utilizes the channels 202 for distribution of the material 108, of FIG. 1. However, the conventional mold system 400 makes use of a material reservoir 402 adjacent the conventional mold system 400. Mold arrows 404 indicate the direction of flow of the material 108 around and within the integrated circuit package system 600 of FIG. 6. The top chaser mold plate, with the honeycomb meshwork of posts 304 and the semiconductor die mold regions 306, may be removed after a sufficient amount of time to reveal a support layer, comprised by the material 108 of FIG. 1 with the discrete hollow conduits 110 of FIG. 1 formed within. Although FIGS. 4 and 5 depict a 3×3 array, it is to be understood that any array suitable for manufacturing may be employed.

Figure 6:
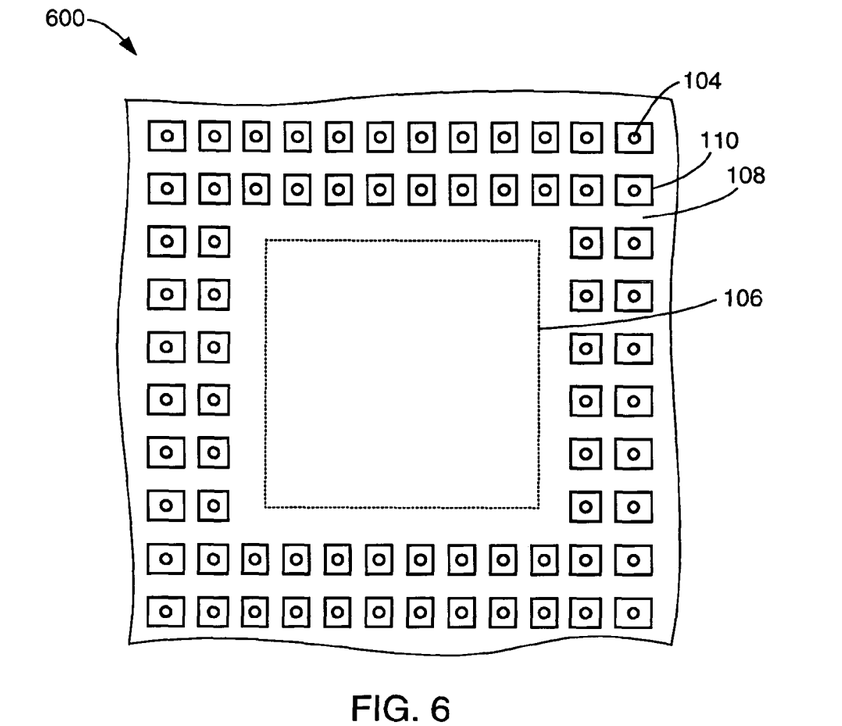
FIG. 6 is a plan view of an integrated circuit package system in accordance with an embodiment of the present invention.

Referring now to FIG. 6, therein is shown a plan view of an integrated circuit package system 600 in accordance with an embodiment of the present invention. The integrated circuit package system 600 includes the electrical contacts 104, the semiconductor die 106, the material 108 and the discrete hollow conduits 110. Initially, the semiconductor die 106 is aligned and adhered to the center of the substrate 102 (not shown). By way of example and not by way of limitation, an adhesive compound may be employed to affix the semiconductor die 106 to a semiconductor die pad located centrally on the substrate 102.

After adhering the semiconductor die 106, the mold plate 300, of FIGS. 3 and 5, with the honeycomb meshwork of posts 304 is laid over the substrate 102. The honeycomb meshwork of posts 304 is aligned to coincide with the electrical contacts 104 on the substrate 102.

After aligning the mold plate 300, the material 108 is deposited between the substrate 102 and the mold plate 300 by techniques well know in the art, such as, top center gate molding and conventional side and/or corner molding. The material 108 may be a plastic, resin or epoxy. However, it is to be understood that the composition of the material 108 is not essential, what is important is that the material 108 provide encapsulation for the semiconductor die 106 and be sufficiently rigid to prevent warping of the substrate 102 during later processing steps.

After a sufficient lapse of time, the mold plate 300 with the honeycomb meshwork of posts 304 is removed, and in its place is left a rigid support layer (i.e.—the material 108) with the discrete hollow conduits 110 providing access to the electrical contacts 104. By forming the discrete hollow conduits 110 in such manner, the material 108 provides a rigid support layer that prevents warping of the substrate 102 during later processing steps. By preventing the warpage so common to package, the electrical pathways between adjacent substrates can be enhanced and the incidence of device or package malfunction, due to failed interconnections, can be prevented.

The electrical contacts 104, mentioned above, provide electrical contact points between adjacent substrates. Just as the external electrical contacts 114 of FIG. 1 remain in the original horizontal plane so do the electrical contacts 104 of FIGS. 1 and 6. By remaining in the same plane (i.e.—the electrical contacts 104 are neither deflected upwards or downwards during processing), the stability of the electrical contacts 104 enhances the probability of forming reliable electrical interconnections between adjacent substrates. Such resistance to deflection during processing increases the KGD aspect of PoP and PiP package structures, and consequently, improves product yield and decreases production costs.

Although FIG. 1 depicted the application of the material 108 to the integrated circuit package system 100, it is to be understood that the integrated circuit package system 600 of FIG. 6, applies to any substrate employed in stacked package, such as, PoP and PiP design. For purposes of illustration, the integrated circuit package system 600 can be employed in the integrated circuit package system 100, a top package or a package formed between the integrated circuit package system 100 and the top package.

Furthermore, although FIG. 6 depicts the discrete hollow conduits 110 formed in the shape of squares, it is to be understood that the discrete hollow conduits 110 may be formed from any shape. For example, the discrete hollow conduits 110 may be shaped as circles, hexagons, squares, or any combination thereof.

Figure 7:
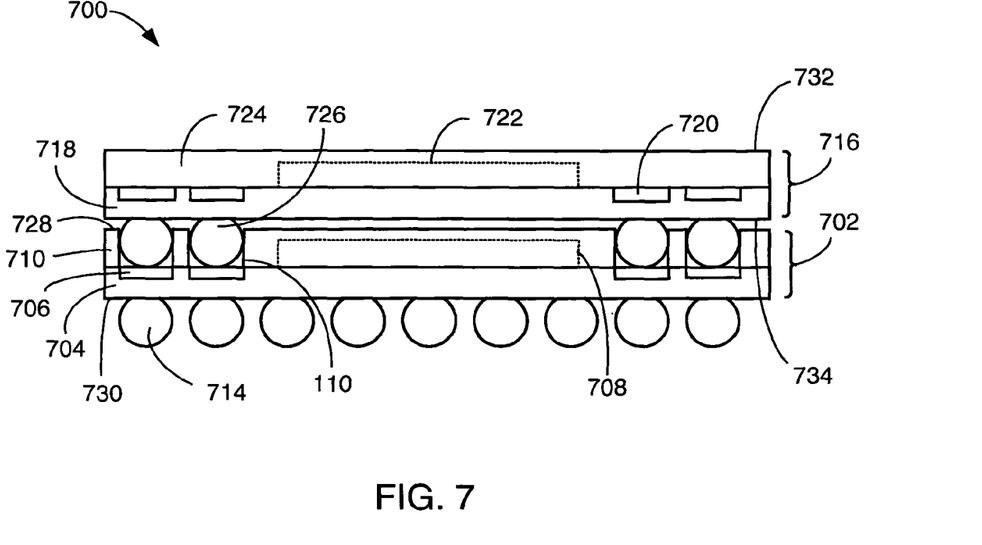
FIG. 7 is a section view of an integrated circuit package system in accordance with an embodiment of the present invention.

Referring now to FIG. 7, therein is shown a section view of an integrated circuit package system 700 in accordance with an embodiment of the present invention. The integrated circuit package system 700, such as an integrated circuit stacked package system, depicts a first package 702 and a second package 716 after reflowing. The first package 702 includes a first substrate 704, first electrical contacts 706, a first semiconductor die 708, a first material 710, first discrete hollow conduits 110, and first external electrical connections 714. The second package 716 includes a second substrate 718, second electrical contacts 720, a second semiconductor die 722, a second material 724, and second external electrical connections 726. In the embodiment of FIG. 7, the first discrete hollow conduits 110 are filled by the second electrical connections 726.

Initially, the integrated circuit package system 700 forms a first package 702. The first package 702 includes a first substrate 704. The first substrate 704 includes a first top surface 728 and a first bottom surface 730, wherein the first top surface 728 includes the first electrical contacts 706 and the first bottom surface 730 includes the first external electrical connections 714. The first material 710 is deposited between the first substrate 704 and a first mold plate (not shown) formed over the first substrate 704. The first mold plate is removed to reveal the first discrete hollow conduits 110 formed within the first material 710. The first discrete hollow conduits 110 are aligned over the first electrical contacts 706 of the first substrate 704.

Then, the second package 716 is provided with a second substrate 718. The second substrate 718 includes a second top surface 732 and a second bottom surface 734, wherein the second top surface 732 includes the second electrical contacts 720 and the second bottom surface 734 includes the second external electrical connections 726. The second external electrical connections 726 are aligned over the first substrate 704 to coincide with the first electrical contacts 706 of the first substrate 704. The second external electrical connections 726 are reflowed to provide electrical interconnections to the first substrate 704 through the first discrete hollow conduits 110 formed within the first material 710 over the first substrate 704.

The first discrete hollow conduits 110 comprise a part of the rigid support layer (i.e.—the first material 710) that imparts stability to the first substrate 704 of the first package 702. The second material 724 may also impart stability to the second substrate 718 of the second package 716. The stability imparted by the first material 710 and the second material 724 prevents the first substrate 704 and the second substrate 718 from warping, and consequently, enhances the quality and durability of the interconnections between the two packages.

Additionally, the second material 724 can be deposited between the second substrate 718 and a second mold plate (not shown) formed over the second substrate 718. The second mold plate can be removed to reveal second discrete hollow conduits formed within the second material 724 over the second substrate 718. Although the second material 724 of the second package 716 does not depict the second discrete hollow conduits, the second material 724 may contain the second discrete hollow conduits, and correspondingly, have another package superposed over the second package 716. The present invention is not to be limited to a single package over another package configuration. The present invention envisions multiple packages formed one over the other, only limited by the design specifications of the particular application.

Furthermore, it is to be understood that the first discrete hollow conduits 110 and the second discrete hollow conduits may be formed from shapes such as circles, squares, hexagons, and combinations thereof.

Referring now to FIGS. 8 through 12. FIGS. 8 through 12 depict similar configurations employed in FIGS. 1 and 4 through 7, therefore, only the differences between the figures will be described, to avoid redundancy.

Figure 8:
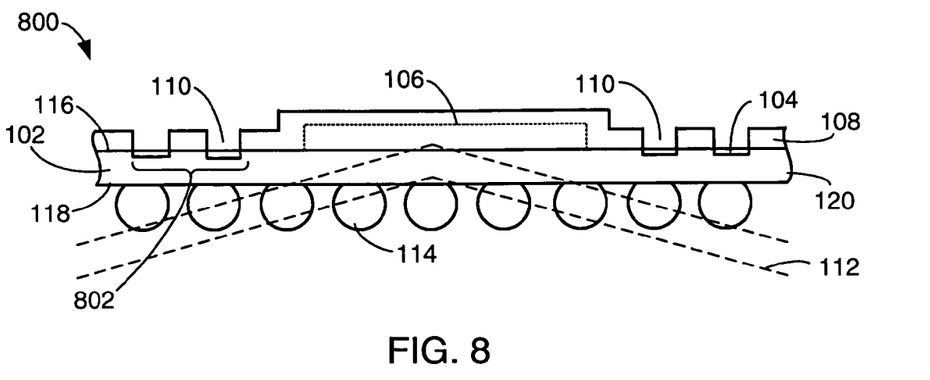
FIG. 8 is a section view of an integrated circuit package system after reflow in accordance with another embodiment of the present invention.

FIG. 8, depicts a section view of a integrated circuit package system 800 after reflow in accordance with another embodiment of the present invention. The integrated circuit package system 800, such as a stepped bottom package, includes the substrate 102, the electrical contacts 104, the semiconductor die 106, the material 108, the discrete hollow conduits 110, such as, stepped discrete hollow conduits, first discrete hollow conduits, or second discrete hollow conduits, the dotted lines 112, the external electrical connections 114, the top surface 116, the bottom surface 118, the perimeter 120, and contact regions 802. Just as with FIG. 1, the integrated circuit package system 800 experiences little deflection from its original horizontal plane due to the structural support offered by the material 108. The dotted lines 112 are representative of the characteristic warpage incurred by prior art bottom packages.

Most notably, FIG. 8 employs the material 108 in a stepped configuration. Per this embodiment, the material 108 encases the semiconductor die 106 but deposits less of the material 108 over the contact regions 802. By depositing less of the material 108 over the contact regions 802, the aspect ratio of the discrete hollow conduits 110 is decreased while maintaining the support provided by the material 108 to the substrate 102. Although not intended to limit the scope of the present invention, some aspects provided by the stepped configuration include reduced material costs and decreased reflow distance of the external electrical connections 114.

Figure 9:
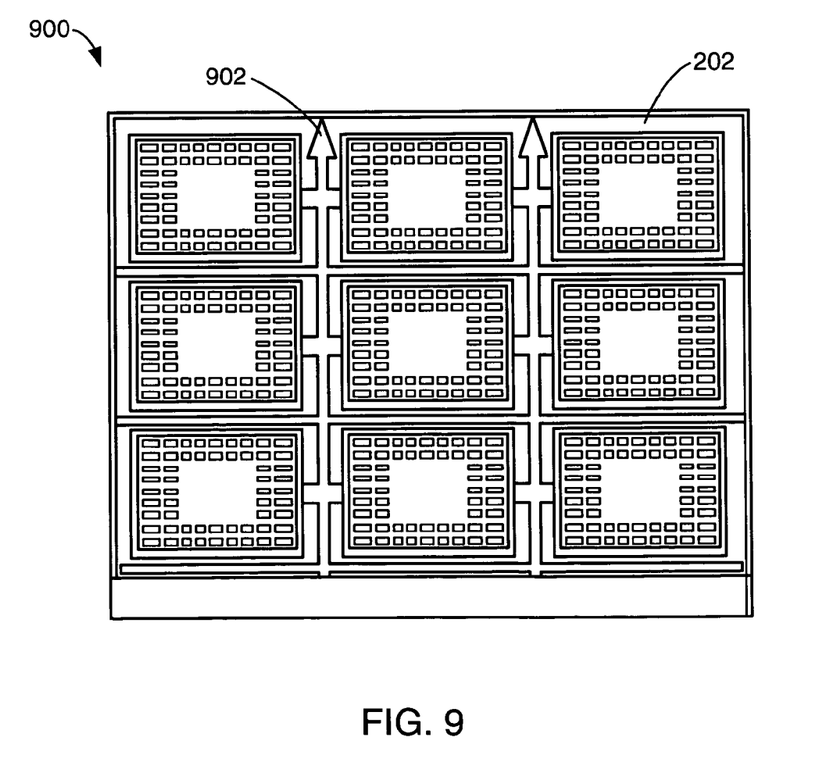
FIG. 9 is a plan view of a stepped conventional mold system in accordance with an embodiment of the present invention.
Figure 10:
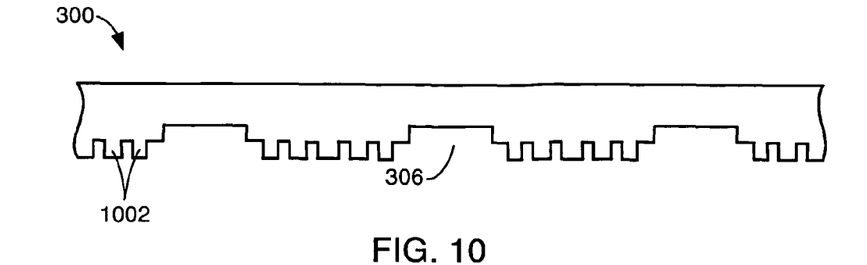
FIG. 10 is a section view of a mold plate, such as a stepped top chaser mold plate, in accordance with an embodiment of the present invention.

Referring now to FIGS. 9 and 10, therein is shown a plan view of a stepped conventional mold system 900 and a section view of a mold plate 300, such as, a stepped top chaser mold plate, the first mold plate, or the second mold plate, in accordance with an embodiment of the present invention. The stepped conventional mold system 900 also utilizes the channels 202 for distribution of the material 108, of FIG. 8. Stepped conventional mold arrows 902 indicate the direction of flow of the material 108 around and within the integrated circuit package system 1100, of FIG. 11. Most notably, the stepped top chaser mold plate utilizes the semiconductor die mold regions 306 and a stepped honeycomb meshwork of posts 1002. Such configuration reduces the aspect ratio of the discrete hollow conduits 110, of FIG. 8.

Although FIGS. 9 and 10 depict a 3×3 array, it is to be understood that any array suitable for manufacturing may be employed. Additionally, although FIGS. 9 and 10 depict a conventional side molding technique, it is to be understood that this illustration is merely being provided for exemplary purposes and is not intended to limit the scope of the present invention.

Figure 11:
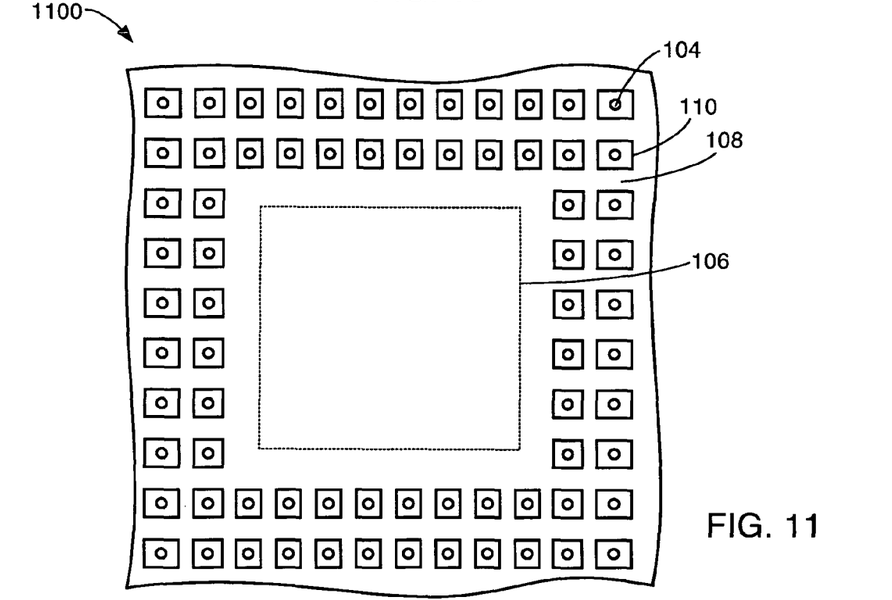
FIG. 11 is a plan view of an integrated circuit package system in accordance with an embodiment of the present invention.

Referring now to FIG. 11, therein is shown a plan view of a integrated circuit package system 1100, in accordance with an embodiment of the present invention. The integrated circuit package system 1100, such as a stepped integrated circuit package system, includes the electrical contacts 104, the semiconductor die 106, the material 108, and the discrete hollow conduits 110. The integrated circuit package system 1100 also uses the mold plate 300 (not shown), such as the stepped top chaser mold plate, when depositing the material 108. The mold plate 300 employed in this embodiment casts the material 108, within the contact regions 802, in a stepped configuration.

Although FIG. 8 depicted the application of the material 108 to the integrated circuit package system 800, it is to be understood that the integrated circuit package system 1100, of FIG. 11, applies to any substrate employed in stacked package, such as, PoP and PiP design. For purposes of illustration, the integrated circuit package system 1100 can be employed in the integrated circuit package system 800, a top package or a package formed between the integrated circuit package system 800 and the top package.

Furthermore, although FIG. 11 depicts the discrete hollow conduits 110 formed in the shape of squares, it is to be understood that the discrete hollow conduits 110 may be formed from any shape. For example, the discrete hollow conduits 110 may be shaped as circles, hexagons, squares, or any combination thereof.

Figure 12:
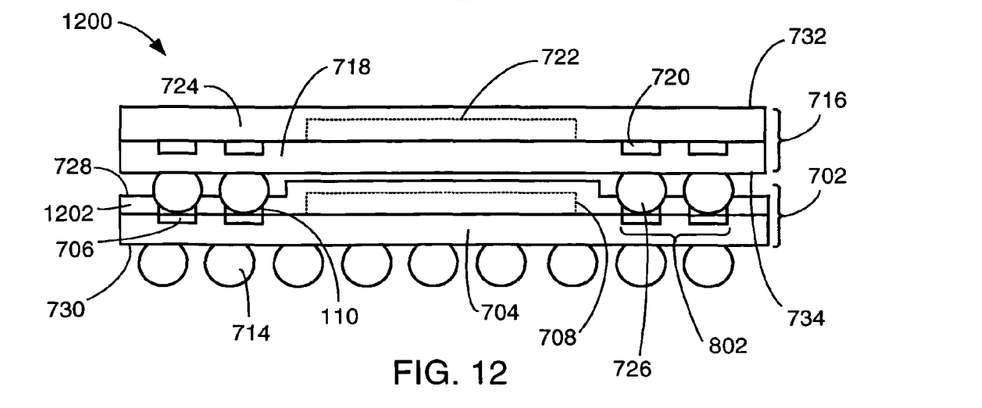
FIG. 12 is a section view of an integrated circuit package system in accordance with an embodiment of the present invention.

Referring now to FIG. 12, therein is shown a section view of a integrated circuit package system 1200 in accordance with an embodiment of the present invention. The integrated circuit package system 1200, such as a stepped integrated circuit stacked package system, depicts the first package 702 and the second package 716 after reflowing. The first package 702 includes the first substrate 704, the first electrical contacts 706, the first semiconductor die 708, the first discrete hollow conduits 110, the first external electrical connections 714 and first stepped material 1202. The second package 716 includes the second substrate 718, the second electrical contacts 720, the second semiconductor die 722, the second material 724, and the second external electrical connections 726. Per the embodiment of FIG. 12, the first discrete hollow conduits 110 are filled by the second electrical connections 726. Additionally, the first substrate 704 includes the first top surface 728 and the first bottom surface 730 and the second substrate 718 includes the second top surface 732 and the second bottom surface 734.

Most notably, the first stepped material 1202 employs a stepped configuration within the contact regions 802 that imparts stability to the first substrate 704 of the first package 702. Although the second package 716 depicts the second material layer 724 without a stepped configuration or the second discrete hollow conduits, the second material layer 724 may possess a stepped configuration, as well as, the second discrete hollow conduits. By forming the second material layer 724 with the stepped configuration and the second discrete hollow conduits, another package may be superposed over the second package 716. The present invention is not to be limited to a single stepped package over another stepped package configuration. The present invention envisions multiple stepped packages formed one over the other, only limited by the design specifications of the particular application.

Furthermore, it is to be understood that the first discrete hollow conduits 110 and the second discrete hollow conduits may be formed from shapes such as circles, squares, hexagons, and combinations thereof.

Referring now to FIGS. 13 through 16, therein are shown plan views of multiple package systems in accordance with different embodiments of the present invention. FIGS. 13 through 16 depict the different shapes of the electrical contacts 104 that can be employed within the multiple package systems. It is to be understood that the multiple package systems of FIGS. 13 through 16 apply to the integrated circuit package systems 600, of FIG. 6, as well as, the integrated circuit package system 1100, of FIG. 11. Additionally, although FIGS. 13 through 16 depict the electrical contacts 104 shaped either as circles, hexagons, or squares, it is to be understood that the electrical contacts 104 within a package system can be any combination of these shapes, as well.

Figure 13:
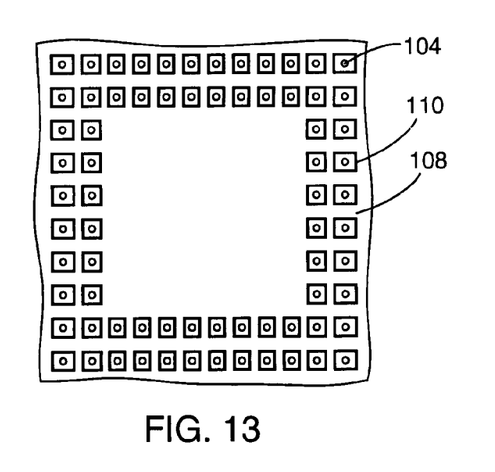
FIG. 13 is a plan view of a package system in accordance with another embodiment of the present invention.

FIG. 13 includes the electrical contacts 104, the material 108, and the discrete hollow conduits 110. Most notably, FIG. 13 depicts the electrical contacts 104 shaped as circles.

Figure 14:
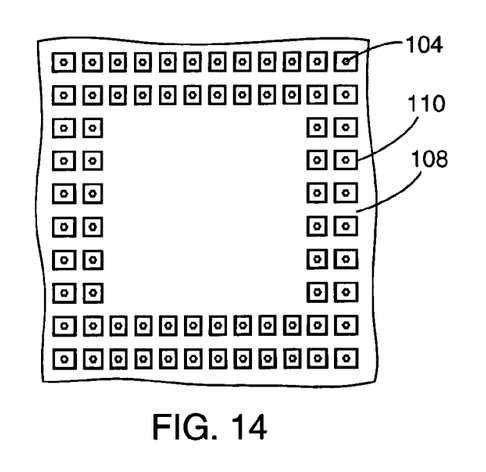
FIG. 14 is a plan view of a package system in accordance with another embodiment of the present invention.

FIG. 14 includes the electrical contacts 104, the material 108, and the discrete hollow conduits 110. Most notably, FIG. 14 depicts the electrical contacts 104 shaped as hexagons.

Figure 15:
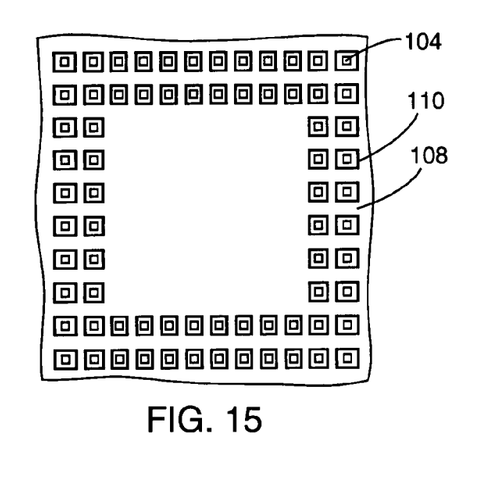
FIG. 15 is a plan view of a package system in accordance with another embodiment of the present invention.

FIG. 15 includes the electrical contacts 104, the material 108, and the discrete hollow conduits 110. Most notably, FIG. 15 depicts the electrical contacts 104 shaped as squares.

Figure 16:
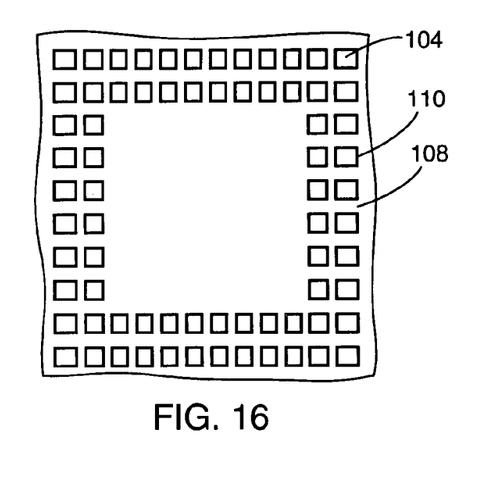
FIG. 16 is a plan view of a package system in accordance with another embodiment of the present invention.

FIG. 16 includes the electrical contacts 104, the material 108, and the discrete hollow conduits 110. Most notably, FIG. 16 depicts the electrical contacts 104 as possessing the same shape and dimensions as the openings provided by the discrete hollow conduits 110.

Figure 17:
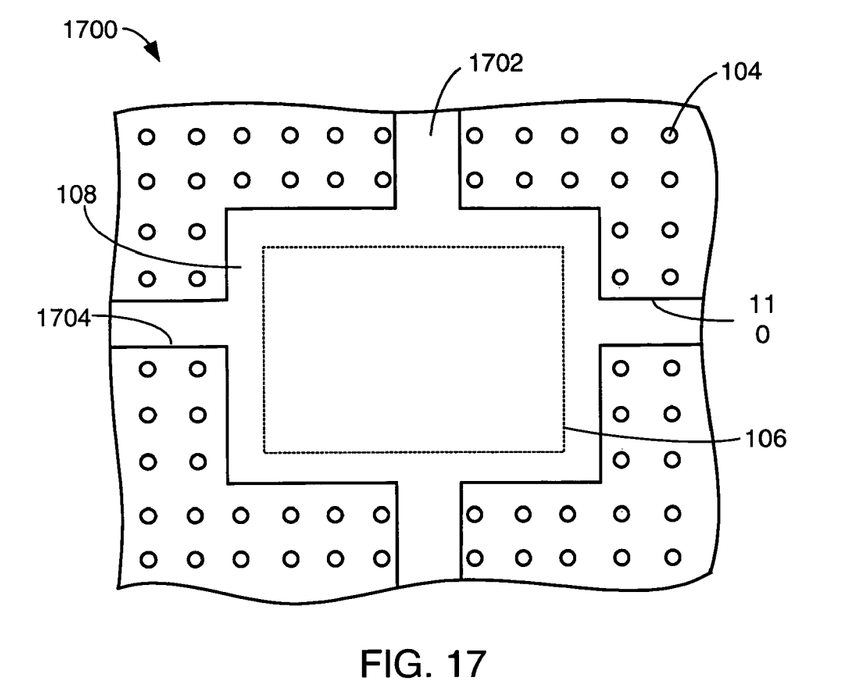
FIG. 17 is a plan view of traces routed to provide larger mold paths in integrated circuit package systems in accordance with another embodiment of the present invention.

Referring now to FIG. 17, therein is shown a plan view of traces routed to provide larger mold paths for an integrated circuit package system 1700 in accordance with another embodiment of the present invention. The traces 1702 extend from the semiconductor die 106 and are enlarged to facilitate the flow of the material 108 throughout the integrated circuit system.

Per this embodiment, the mold plate 300 (not shown) contains a honeycomb meshwork of posts or a stepped honeycomb meshwork of posts that covers L-shaped regions 1704. By covering the L-shaped regions 1704 with the mold plate 300, the electrical contacts 104 are not obscured by the material 108. Consequently, the electrical contacts 104 remain exposed, after removal of the mold plate 300, for attachment to a superposed substrate (not shown). The L-shaped regions 1704 exposed after the removal of the mold plate 300 act as the discrete hollow conduits 110 and, as with the previous embodiments, the material 108 imparts structural stability to the package.

Figure 18:
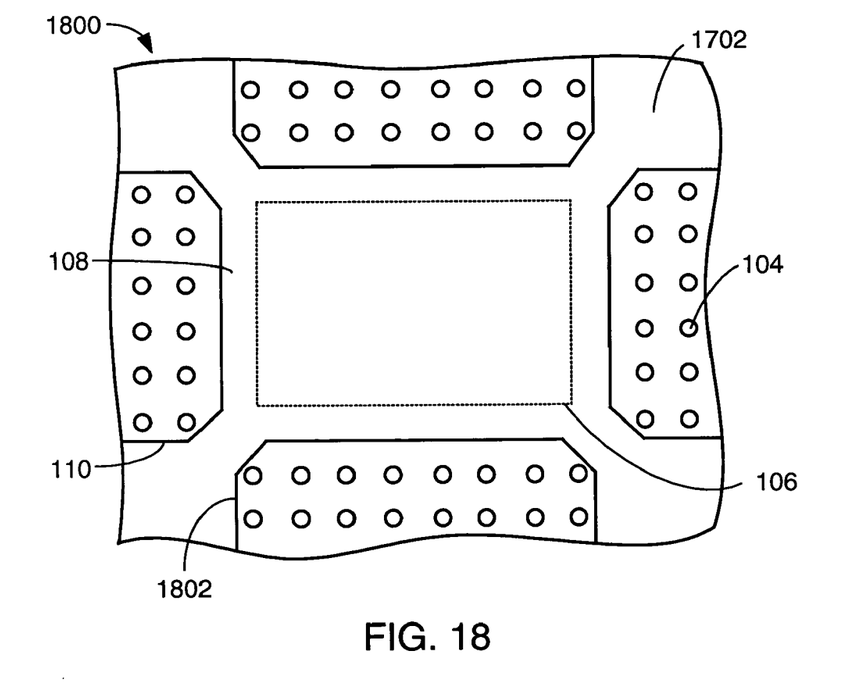
FIG. 18 is a plan view of traces routed to provide larger mold paths in integrated circuit package systems in accordance with another embodiment of the present invention.

Referring now to FIG. 18, therein is shown a plan view of traces routed to provide larger mold paths for an integrated circuit package system 1800 in accordance with another embodiment of the present invention. The traces 1702 extend from the semiconductor die 106 and are enlarged to facilitate the flow of the material 108 throughout the integrated circuit system.

Per this embodiment, the mold plate 300 (not shown) contains a honeycomb meshwork of posts or a stepped honeycomb meshwork of posts that covers rectangular shaped regions 1802. By covering the rectangular shaped regions 1802 with the mold plate 300, the electrical contacts 104 are not obscured by the material 108. Consequently, the electrical contacts 104 remain exposed, after removal of the mold plate 300, for attachment to a superposed substrate (not shown). The rectangular shaped regions 1802 exposed after the removal of the mold plate 300 act as the discrete hollow conduits 110 and, as with the previous embodiments, the material 108 imparts structural stability to the package.

Figure 19:
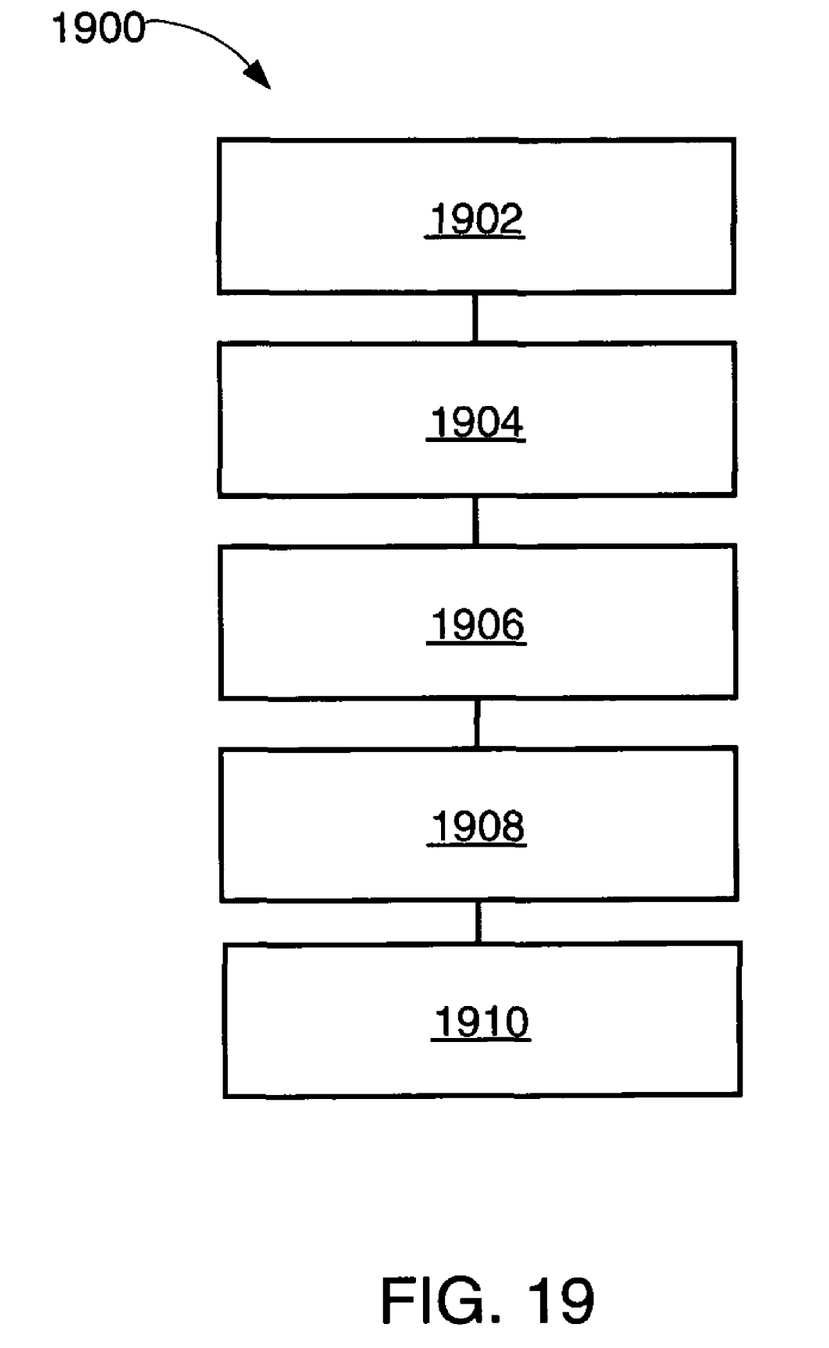
FIG. 19 is a flow chart for an integrated circuit package system for fabricating the integrated circuit package system in accordance with an embodiment of the present invention.

Referring now to FIG. 19, therein is shown a flow chart for an integrated circuit package system 1900 for fabricating the integrated circuit package system 100, 600, 700, 800, 1100, 1200, 1700 or 1800 in accordance with an embodiment of the present invention. The system 1900 includes providing a substrate with a top surface and a bottom surface in a block 1902; configuring the top surface to include electrical contacts formed between a perimeter of the substrate and a semiconductor die in a block 1904; aligning over the top surface of the substrate a mold plate with a honeycomb meshwork of posts or a stepped honeycomb meshwork of posts in a block 1906; depositing a material to prevent warpage of the substrate between the top surface of the substrate and the mold plate in a block 1908; and removing the mold plate to reveal discrete hollow conduits formed within the material that align with the electrical contacts in a block 1910.

It has been discovered that the present invention thus has numerous aspects. An aspect of the present invention is that it provides structural integrity to a substrate incorporated into a stacked package structure, such as, PoP and PiP. By providing structural support to a substrate, warping of the substrate can be prevented during later processing steps.

Another aspect of the present invention is the prevention of failed interconnects due to warping of the substrate. By preventing warpage, the electrical pathways between adjacent substrates can be enhanced and the incidence of device or package malfunction, due to failed interconnects, can be prevented.

These and other valuable aspects of the present invention consequently further the state of the technology to at least the next level.

Thus, it has been discovered that the integrated circuit package systems of the present invention furnishes important and heretofore unknown and unavailable solutions, capabilities, and functional aspects. For instance, by providing a process that lends structural support to substrates and packages through a material including a honeycomb meshwork of discrete hollow conduits, the quality and integrity of interconnects between adjacent substrates and packages can be enhanced. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
providing a substrate with a top surface and a bottom surface;
configuring the top surface to include electrical contacts formed between a perimeter of the substrate and a semiconductor die;

aligning over the top surface of the substrate a mold plate;
depositing a material to prevent warpage of the substrate between the top surface of the substrate and the mold plate; and
removing the mold plate to reveal stepped discrete hollow conduits formed within the material that align with the electrical contacts.

2. The method as claimed in claim 1 wherein:
depositing the material includes top center gate molding, conventional side molding or conventional corner molding techniques.

3. The method as claimed in claim 1 wherein:
configuring the electrical contacts includes the electrical contacts selected from shapes including circles, squares, hexagons, and combinations thereof.

4. The method as claimed in claim 1 further comprising:
forming external electrical connections on the bottom surface of the substrate.

5. The method as claimed in claim 1 further comprising:
configuring the integrated circuit package system to include a package-on-package configuration or a package-in-package configuration.

6. A method of manufacture of an integrated circuit package system comprising:
providing a first package with a first substrate;
configuring the first substrate to include a first top surface including first electrical contacts and a first bottom surface including first external electrical connections;
depositing a first material between the first substrate and a first mold plate formed over the first substrate;
removing the first mold plate to reveal first stepped discrete hollow conduits formed within the first material that are aligned over the first electrical contacts of the first substrate; and
providing a second package with a second substrate and a second material formed over and electrically connected to the first package through the first stepped discrete hollow conduits.

7. The method as claimed in claim 6 further comprising:
depositing the second material between the second substrate and a second mold plate formed over the second substrate; and
removing the second mold plate to reveal second discrete hollow conduits formed within the second material over the second substrate.

8. The method as claimed in claim 7 wherein:
removing the second mold plate formed over the second substrate includes revealing stepped discrete hollow conduits.

9. The method as claimed in claim 6 wherein:
depositing the first material and the second material provides structural integrity to the first substrate and the second substrate that prevents warping during subsequent processing.

10. An integrated circuit package system comprising:
a substrate with a top surface and a bottom surface;
the top surface includes electrical contacts formed between a perimeter of the substrate and a semiconductor die;
a material that prevents warpage of the substrate over the top surface of the substrate; and
stepped discrete hollow conduits within the material that are aligned over the electrical contacts.

11. The system as claimed in claim 10 further comprising:
external electrical connections formed on the bottom surface of the substrate.

12. The system as claimed in claim 10 wherein:
the electrical contacts are selected from shapes including circles, squares, hexagons, and combinations thereof.

13. The system as claimed in claim 10 wherein:
the substrate is part of a first package and a second package is formed thereover.

14. The system as claimed in claim 10 wherein:
the integrated circuit package system includes forming a package-on-package configuration or a package-in-package configuration.

15. An integrated circuit package system comprising:
a first package with a first substrate including a first top surface and a first bottom surface;
first electrical contacts formed on the first top surface of the first substrate and first external electrical connections formed on the first bottom surface of the first substrate;
a first material over the first substrate for preventing warpage of the first substrate having first stepped discrete hollow conduits formed within and over the first substrate; and
a second package including a second substrate and a second material formed over and electrically connected to the first package through the first stepped discrete hollow conduits.

16. The system as claimed in claim 15 wherein:
the second material includes second discrete hollow conduits formed within and over the second substrate.

17. The system as claimed in claim 16 wherein:
the second discrete hollow conduits are selected from shapes including circles, squares, hexagons, and combinations thereof.

18. The system as claimed in claim 15 further comprising:
additional packages formed over the second package.

19. The system as claimed in claim 15 wherein:
the first discrete hollow conduits are selected from shapes including circles, squares, hexagons, and combinations thereof.

* * * * *